United States Patent
Kampf et al.

(10) Patent No.: US 7,480,607 B2
(45) Date of Patent: Jan. 20, 2009

(54) CIRCUIT DESIGN VERIFICATION

(75) Inventors: Francis A. Kampf, Jeffersonville, VT (US); Douglas Thomas Massey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 11/383,299

(22) Filed: May 15, 2006

(65) Prior Publication Data

US 2007/0265820 A1 Nov. 15, 2007

(51) Int. Cl.
*G06F 17/50* (2006.01)

(52) U.S. Cl. .............................. 703/14; 703/19; 716/4; 716/5; 716/6

(58) Field of Classification Search .................. 703/13, 703/14, 19; 716/4–6
See application file for complete search history.

(56) References Cited

U.S. PATENT DOCUMENTS

| | | | | |
|---|---|---|---|---|
| 7,039,884 B2* | 5/2006 | Kitchin | ........................... | 716/4 |
| 7,251,794 B2* | 7/2007 | Blanco et al. | .................. | 716/4 |
| 2006/0074622 A1* | 4/2006 | Scott et al. | ..................... | 703/23 |

OTHER PUBLICATIONS

McDonald et al., C.B. Symbolic Timing Simulation Using Cluster Scheduling, IEEE, Proceedings of the 2000, 37th Design Automation onference, Jun. 2000, pp. 254-259.*
McDonald et al., C.B. CMOS Circuit Verification with Symbolic Switch-Level Timing Simulation, IEEE Transactions on Computer-Aided Design of Integrated Circuits and Systems, vol. 20, No. 3, Mar. 2001, pp. 458-474.*

* cited by examiner

*Primary Examiner*—Russell Frejd
(74) *Attorney, Agent, or Firm*—Schmeiser, Olsen & Watts; Michael J. LeStrange

(57) ABSTRACT

A digital circuit simulation method. The method starts with a digital circuit design which includes: a first source latch, a destination latch, a logic cone, a first WAM circuit electrically coupling an output of the first source latch to a first input of the logic cone, and a WAGG circuit electrically coupling an output of the logic cone and an input of the first source latch. Then, a zero-delay simulation is performed in which if a first situation of (a) the first WAM circuit entering an uncertainty state in which the first WAM circuit generates a random value of 1 or 0 at the first input of the logic cone, (b) the logic cone being vulnerable to a positive glitch, and (c) the output of the logic cone being at logic 0, the WAGG circuit generates a random value of 0 or 1 at the input of the destination latch.

20 Claims, 4 Drawing Sheets

```
module wagg (
  positive_glitch_enable,
  negative_glitch_enable,
  datain,
  dataout
);

input  positive_glitch_enable;
  input  negative_glitch_enable;
  input  datain;
  output dataout;

parameter random_seed = 0;

reg [31:0] random_number;
  reg wagg_data;

`ifndef WAM_ON
  assign dataout = datain;
`else

// --------------
// random data generation
// --------------
  always @(posedge positive_glitch_enable or posedge negative_glitch_enable)
    begin
      if (random_seed == 0)
        random_number = $random;
      else
        random_number = $random(random_number);
      if ((random_number % 2) == 0)
        if (positive_glitch_enable==1 && datain==0)
          wagg_data <= ~datain;
        else if (negative_glitch_enable==1 && datain==1)
          wagg_data <= ~datain;
        else
          wagg_data <= datain;
      else
        wagg_data <= datain;
    end // --------------
// output data assignment
// --------------
  assign dataout = ( (positive_glitch_enable | negative_glitch_enable) & wagg_data)
                 | (~(positive_glitch_enable | negative_glitch_enable) & datain);

// --------------
// initialize
// --------------
  initial
    begin
      if (random_seed == 0)
        random_number = $random;
      else
        random_number = random_seed;
      wam_data = random_number[0];
    end `endif endmodule
```

FIG. 3B

CIRCUIT DESIGN VERIFICATION

BACKGROUND OF THE INVENTION

1. Technical Field

The present invention relates to circuit design verification, and more specifically, to circuit design verification using zero-delay simulation.

2. Related Art

Zero-delay simulation is typically used to verify a circuit design. However, if (a) the circuit design comprises components operating according to different, asynchronous clocks and (b) the circuit design is vulnerable to glitches, the simulation result does not correctly reflect the behavior of the actual circuit built from the circuit design. Therefore, there is a need for a zero-delay simulation method that improves the simulation result of the prior art.

SUMMARY OF THE INVENTION

The present invention provides a digital circuit simulation method, comprising providing a digital circuit design which includes (a) a first source latch, (b) a destination latch, (c) a logic cone, (d) a first WAM (Wired Asynchronous Model) circuit electrically coupling an output of the first source latch to a first input of the logic cone, (e) a WAGG (Wired Asynchronous Glitch Generator) circuit electrically coupling an output of the logic cone to an input of the first source latch, wherein the first source latch operates according to a first clock signal, wherein the first WAM circuit and the destination latch operate according to a second clock signal which is asynchronous to the first clock signal, and wherein there exist at least two different signal paths from the first input of the logic cone through the logic cone to the output of the logic cone; and performing a zero-delay simulation of the digital circuit design, wherein said performing the zero-delay simulation comprises in response to a first situation of (a) the first WAM circuit entering an uncertainty state in which the first WAM circuit generates a random value of 1 or 0 at the first input of the logic cone, (b) the logic cone being vulnerable to a positive glitch, and (c) the output of the logic cone being at logic 0, causing the WAGG circuit to generate a random value of 0 or 1 at the input of the destination latch.

The present invention provides a digital circuit simulation method, comprising providing a digital circuit design, wherein the digital circuit design includes (a) a first source latch, (b) a destination latch, (c) a logic cone, (d) a first WAM (Wired Asynchronous Model) circuit electrically coupling an output of the first source latch to a first input of the logic cone, (e) a WAGG (Wired Asynchronous Glitch Generator) circuit electrically coupling an output of the logic cone and an input of the first source latch; wherein the first source latch operates according to a first clock signal, wherein the first WAM circuit and the destination latch operate according to a second clock signal which is asynchronous to the first clock signal, wherein there exist at least two different signal paths from the first input of the logic cone through the logic cone to the output of the logic cone; and performing a zero-delay simulation of the digital circuit design, wherein said performing the zero-delay simulation comprises in response to a first situation of (a) the first WAM circuit entering an uncertainty state in which the first WAM circuit generates a random value of 1 or 0 at the first input of the logic cone, (b) the logic cone being vulnerable to a negative glitch, and (c) the output of the logic cone being at logic 1, causing the WAGG circuit to generate a random value of 0 or 1 at the input of the destination latch.

The present invention provides a zero-delay simulation method that improves the simulation result of the prior art.

BRIEF DESCRIPTION OF THE DRAWINGS

FIG. 3B illustrates a Verilog program for a WAGG circuit of FIG. 3, in accordance with embodiments of the present invention.

DETAILED DESCRIPTION OF THE INVENTION

Figure 1:
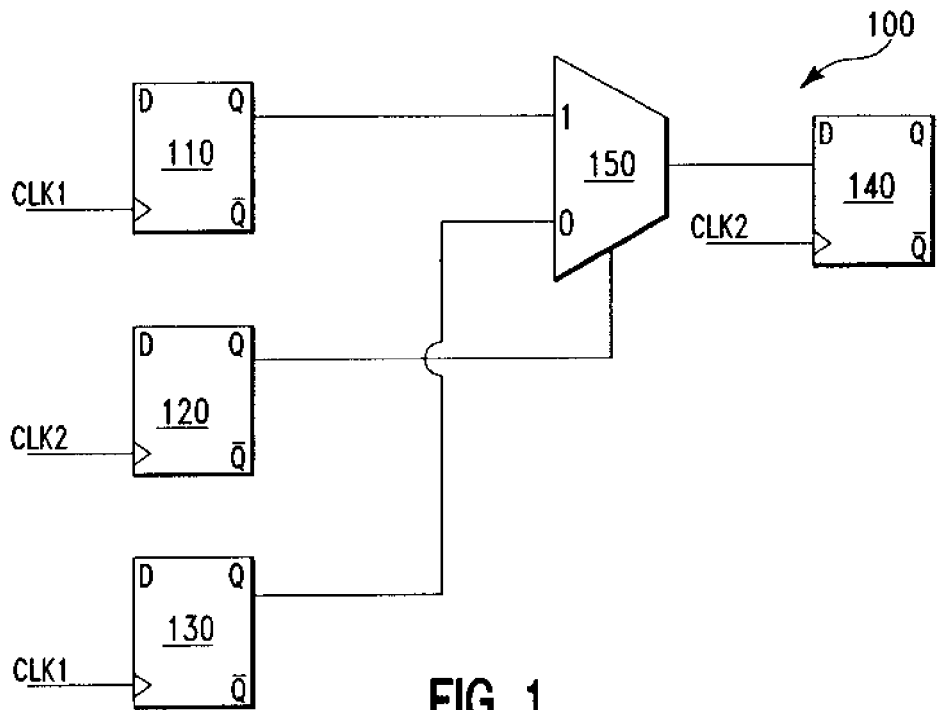
FIGS. 1-3 illustrates a design process, in accordance with embodiments of the present invention.

FIG. 1 illustrates a functional circuit design 100, in accordance with embodiments of the present invention. Illustratively, the functional circuit design 100 includes three source latches 110, 120, and 130, a destination latch 140, and a multiplexer 150. The source latch 110 operates according to a clock signal CLK1 and generates a first output signal to the multiplexer 150. The source latch 120 operates according to a clock signal CLK2 and generates a second output signal to the multiplexer 150. The source latch 130 operates according to the clock signal CLK1 and generates a third output signal to the multiplexer 150. The multiplexer 150 (i) receives as inputs the first and third output signals and (ii) receives the second output signal as a control signal. The multiplexer 150 generates an output signal to the destination latch 140. The destination latch 140 receives (a) the output signal of the multiplexer 150 as an input signal and (b) the signal CLK2 as a clock signal.

In one embodiment, the operation of the functional circuit design 100 is as follows. If the second output signal is at logic 0, then the multiplexer 150 passes the third output signal of the source latch 130 to the destination latch 140. If the second output signal is at logic 1, then the multiplexer 150 passes the first output signal of the source latch 110 to the destination latch 140.

In one embodiment, the two clock signals CLK1 and CLK2 are asynchronous to each other. As a result, the destination latch 140 is synchronous to the source latch 120 but is asynchronous to the source latches 110 and 130.

Figure 2:
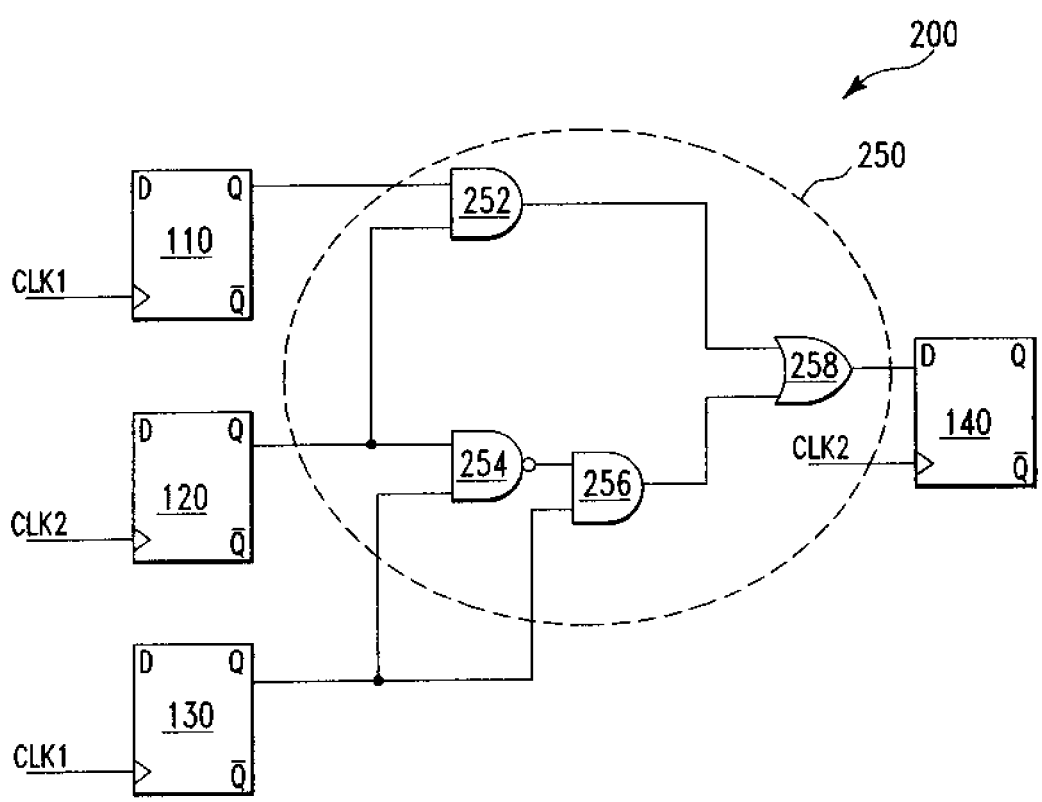

FIG. 2 illustrates a gate-level circuit design 200 of the functional circuit design 100 as a result of a synthesis process, in accordance with embodiments of the present invention. In one embodiment, the gate-level circuit design 200 is similar to the functional circuit design 100 of FIG. 1, except for the replacement of the multiplexer 150 (FIG. 1) by two AND gates 252 and 256, a NAND gate 254, and an OR gate 258, and some wiring changes. As can be seen in the FIG. 2, a logic cone 250 can be defined as including the two AND gates 252 and 256, the NAND gate 254, and the OR gate 258.

In one embodiment, the AND gate 252 receives as inputs the first and second output signals and generates an output signal to the OR gate 258. The NAND gate 254 receives as inputs the second and third output signals and generates an output signal to the AND gate 256. The AND gate 256 receives as inputs the output of the NAND gate 254 and the third output signal and generate an output signal to the OR gate 258. The OR gate 258 receives as inputs the output of the AND gate 252 and the output of the AND gate 256 and generates a fourth output signal to the destination latch 140.

In other words, the logic cone 250 receives as inputs the first output signal of the first source latch 110, the second output signal of the second source latch 120, and the third output signal of the third source latch 130 and generates an output signal to the destination latch 140 as the fourth output signal.

Figure 3:
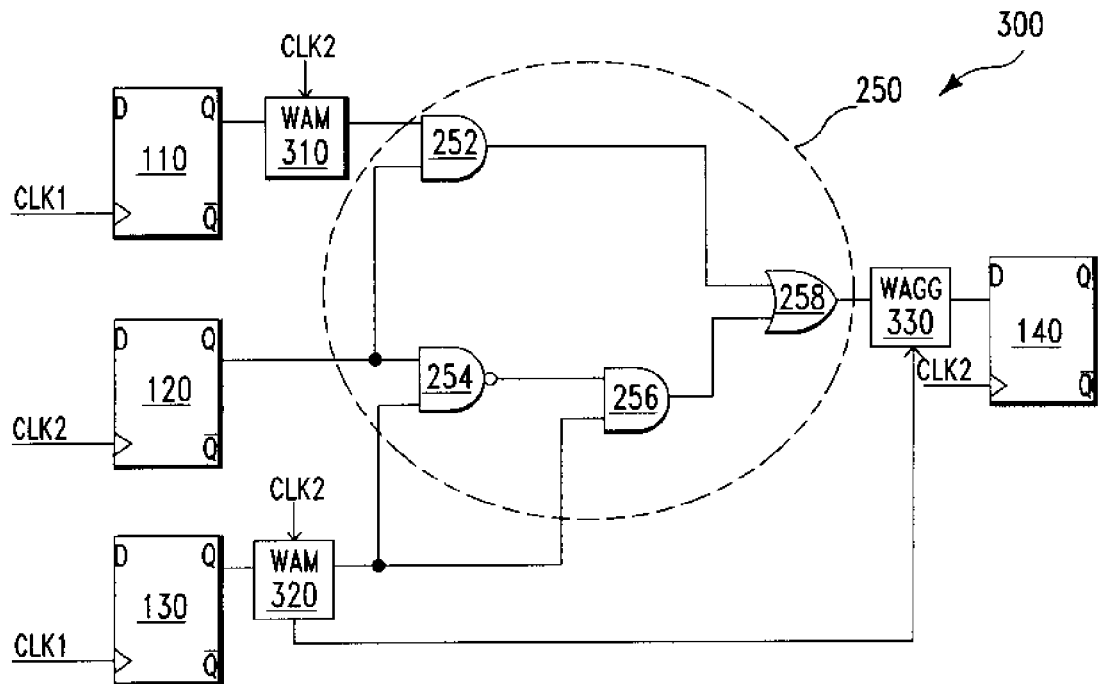

FIG. 3 illustrates a circuit design 300 which is a modified embodiment of the gate-level circuit design 200 of FIG. 2, in accordance with embodiments of the present invention. In one embodiment, the circuit design 300 is similar to the gate-level circuit design 200 of FIG. 2, except that the circuit design 300 comprises two WAM (Wired Asynchronous Model) circuits 310 and 320 and a WAGG (Wired Asynchronous Glitch Generator) circuit 330.

More specifically, the WAM circuit 310 is inserted at the output of the source latch 110, whereas the WAM circuit 320 is inserted at the output of the source latch 130. Both the WAM circuits 310 and 320 receive clock signal CLK2. The WAGG circuit 330 is inserted at the data input of the destination latch 140. In addition, the WAGG circuit 330 receives an uncertainty notifying signal from the WAM circuit 320. It should be noted that the insertion of the WAM circuits 310 and 320 and the WAGG circuit 330 in the gate-level circuit design 200 of FIG. 2 is to make the result of the zero-delay simulation of the output Q of the destination latch 140 better reflect reality. More details will be discussed below.

Figure 3A:
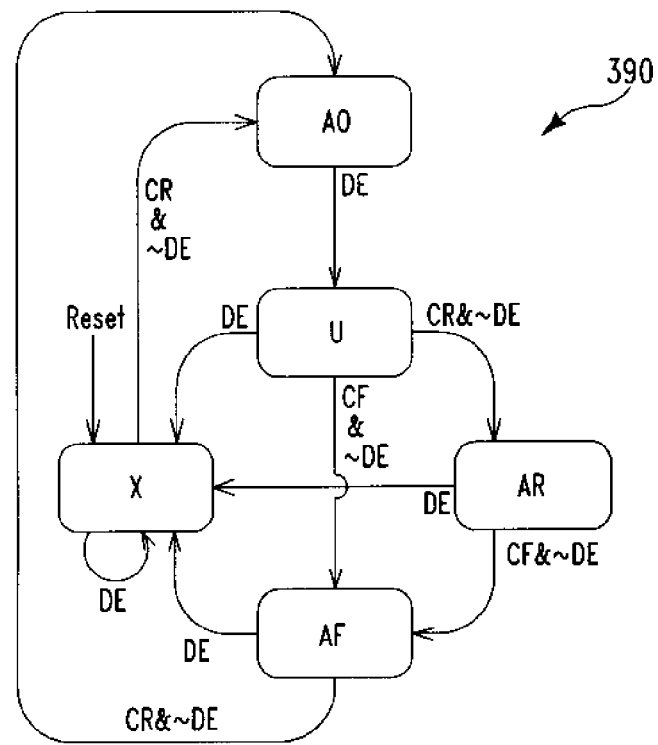
FIG. 3A illustrates a state diagram of a WAM circuit of FIG. 3, in accordance with embodiments of the present invention.

FIG. 3A illustrates an exemplary state transition diagram 390 for the WAM circuit 310, in accordance with embodiments of the present invention. More specifically, the WAM circuit 310 has states A0, U, AR, AFT and X. When the WAM circuit 310 is in the A0, U3, AR and AFT states, the WAM circuit 310 generates at its output either a logical one or a logical zero. The X state is a state that indicates an asynchronous error and has no value. Data is generated at the output of the WAM circuit 310 when defined events occur.

There are three defined events for the WAM circuit 310: a data edge (DE) occurs at the input of the WAM circuit 310 (i.e., a one-to-zero transition or a zero-to-one transition), a destination clock (CLK2) rising edge occurs not exactly at a data edge DE (i.e., CR & ~DE), and a destination clock (CLK2) falling edge occurs not exactly at a data edge DE (i.e., CF & ~DE). The phrase "not exactly at a data edge" (~DE) is defined as within a selected time of a change of the logic level on the output of a source latch (i.e., if the data transition is early or late by a selected amount of time relative to the clock edge).

When the WAM circuit 310 is in the actual states A0, AR, and AFT, the WAM circuit 310 serves as a wire connecting its input to its output. When the WAM circuit 310 is in the uncertainty state U, the WAM circuit 310 randomly selects one of the two logic values of zero and one and generates that randomly selected value to its output (which is also an input of the AND gate 252).

As an example of how the WAM circuit 310 operates according to the exemplary state transition diagram 390 of FIG. 3A, assume that the WAM circuit 310 is currently in state X. Assume that a DE then occurs at the input of the WAM circuit 310. As a result, the WAM circuit 310 stays in the X state. Assume that a CR & ~DE then occurs. As a result, the WAM circuit 310 enters actual state Ac in which the WAM circuit 310 passes the value at its input to its output unchanged. Assume that a DE then occurs. As a result, the WAM circuit 310 enters the uncertainty state U in which the WAM circuit 310 generates a randomly selected value of 1 or 0 at its output.

In one embodiment, the operation of the WAM circuit 320 is similar to the operation of the WAM circuit 310.

It should be noted that the WAM circuit 310 is inserted at the output of the source latch 110 because the source latch 110 and the destination latch 140 operate on different and asynchronous clock signals CLK1 and CLK2, respectively. Similarly, the WAM circuit 320 is inserted at the output of the source latch 130 because the source latch 130 and the destination latch 140 operate on different and asynchronous clock signals CLK1 and CLK2, respectively. No WAM circuit needs to be inserted at the output of the source latch 120 because the source latch 120 and the destination latch 140 operate on the same clock signal CLK2.

For better understanding of the purpose of the WAM circuits 310 and 320, assume that a zero-delay simulation is performed for the circuit 200 of FIG. 2. A as a result, with reference to FIG. 2, a first data transition (0 to 1 or 1 to 0) at the output of the source latch 110 at a CLK1 rising edge would propagate to and instantly be present (i.e., zero delay) at the data input of the destination latch 140. Therefore, at a next CLK2 rising edge, the first data transition would continue to propagate to and instantly be present at the output Q of the destination latch 140. This is always the case regardless how close to the CLK1 rising edge the subsequent CLK2 rising edge may be. In reality, it takes time for the first data transition to propagate and, therefore, the CLK2 rising edge may occur so close to the CLK1 rising edge that at the time of the CLK2 rising edge, the first data transition at the output of the source latch 110 has not yet arrived at the data input of the destination latch 140. As a result, always allowing the first data transition to be instantly at the output of the destination latch 140 at the CLK2 rising edge in zero-delay simulation would not correctly reflect the actual operation of the circuit 200.

The insertion of the WAM circuit 310 at the output of the source latch 110 as shown in FIG. 3 improves the result of zero-delay simulation. Although the insertion of the WAM circuit 310 as shown in FIG. 3 does not help predict the actual value of the output of the destination latch 140, but the insertion of the WAM circuit 310 causes the simulation value of the output of the destination latch 140 to become random for times of uncertainty (e.g., at the CLK2 rising edge when it is not certain whether the first data transition has yet arrived at the input of the destination latch 140). This better reflects reality than always allowing the first data transition to be instantly present at the input of the destination latch 140 at the CLK1 rising edge as in the zero-delay simulation of the circuit 200 of FIG. 2.

It should be noted that insertion of the WAM circuit 320 at the output of the source latch 130 as shown in FIG. 3 serves a similar purpose. That is to cause the simulation value of the output of the destination latch 140 to become random for times of uncertainty (e.g., at the CLK2 rising edge when it is not certain whether a previous data transition at the output of the source latch 130 has yet arrived at the input of the destination latch 140.

For better understanding of the purpose of the WAGG circuit 330, assume that a zero-delay simulation is performed for the circuit 300 of FIG. 3 with the WAGG circuit 330 not being inserted at the data input of the destination latch 140. As a result, with reference to FIG. 3, in the zero-delay simulation, a second data transition at the output of the WAM circuit 320 would instantly propagate through two separate paths (i.e., directly to the AND gate 256 and indirectly to the AND gate 256 via the NAND gate 254) and instantly be present at the input of the destination latch 140. However, in reality, the signal propagation through the two separate paths may have different delays. As a result, in reality, there may be a significant glitch at the input of the destination latch 140, whereas there would be no glitch at all in zero-delay simulation.

The insertion of the WAGG circuit 330 at the data input of the destination latch 140 as shown in FIG. 3 improves the result of zero-delay simulation. Although the insertion of the WAGG circuit 330 as shown in FIG. 3 does not predict the actual glitch at the input of the destination latch 140, but the insertion of the WAGG circuit 330 causes the simulation value of the input of the destination latch 140 to become random for times of uncertainty (i.e., when, among other situations, the second data transition may cause a glitch at the input of the destination latch 140).

In one embodiment, the operation of the WAGG 330 is as follows. On one hand, if (a) the WAM 320 is in the uncertainty state, (b) the logic cone 250 is vulnerable to a positive glitch, and (c) the output of the logic cone 250 (i.e., the input of the destination latch 140) is at logic 0, then the WAGG 330 generates a random value (either zero or one) at its output Q. This is because the presence of all these three conditions (a), (b), and (c) indicates uncertainty at the output of the logic cone 250. It should be noted that, the clause "the logic cone 250 is vulnerable to a positive glitch" means the output signal of the logic cone 250 is at logic 0 but may suddenly increase to logic 1 and then decrease to logic 0 a very short time later due to a signal splitting and then reconverting while propagating in the logic cone 250 towards the output of the logic cone 250. On the other hand, if (a) WAM 320 is in the uncertainty state, (b) the logic cone 250 is vulnerable to a negative glitch, and (c) the fourth output of the logic cone is at logic 1, then the WAGG 330 generates a random value (either zero or one) at its output Q. This is because the presence of all these three conditions (a), (b), and (c) indicates uncertainty at the output of the logic cone 250. It should be noted that, the clause "the logic cone 250 is vulnerable to a negative glitch" means the output signal of the logic cone 250 is at logic 1 but may suddenly decrease to logic 0 and then increase to logic 1 a very short time later due to a signal splitting and then reconverting while propagating in the logic cone 250 towards the output of the logic cone 250.

Other than the two situations described above, the WAGG 330 passes data from its input to its output unchanged. For example, if (a) WAM 320 is in the uncertainty state U, (b) the logic cone 250 is vulnerable to a positive glitch but not vulnerable to a negative glitch, but (c) the fourth output of the logic cone is at logic 1, then the WAGG 330 passes data from its input to its output.

It should be noted that, the logic cone 250 is in fact vulnerable to the positive glitch but not vulnerable to the negative glitch.

FIG. 3B shows a Verilog simulation program for the WAGG 330, in accordance with embodiments of the present invention.

Figure 4:
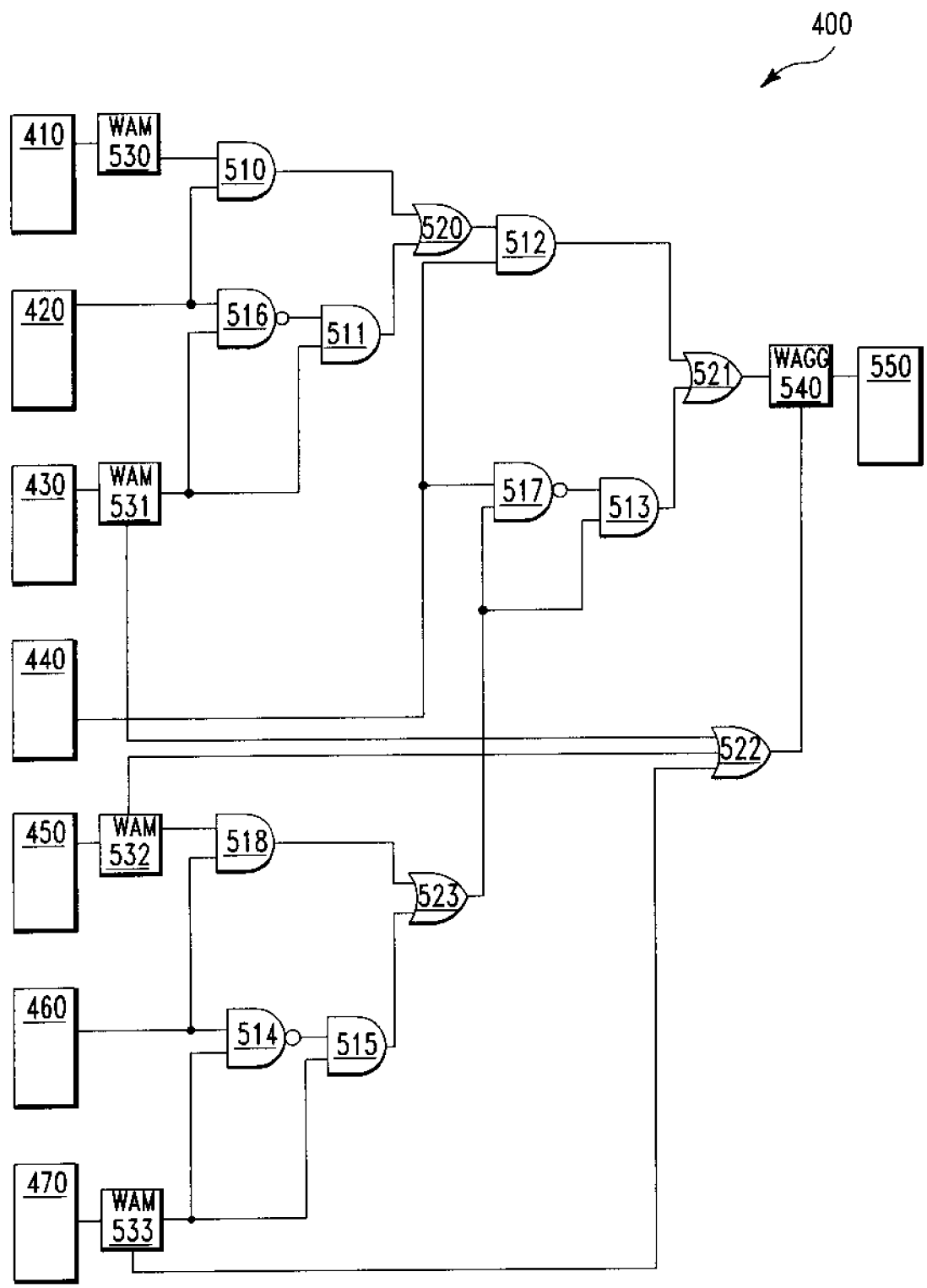
FIG. 4 illustrates another design using WAM and WAGG circuits, in accordance with embodiments of the present invention.

FIG. 4 illustrates a circuit design 400, in accordance with embodiments of the present invention. Illustratively, the circuit design 400 comprises source latches 410, 420, 430, 440, 450, 460, and 470 and a destination latch 550. In one embodiment, the circuit design 400 also comprises some AND, OR, and NAND gates as shown.

Assume that the latches 410, 430, 450, and 470 operate according to a clock signal different from the clock signal for the destination latch 550. As a result, a WAM circuit similar to the WAM circuit 310 of FIG. 3 should be inserted at the output of each of these latches 410, 430, 450, and 470. More specifically, WAM circuits 530, 531, 532, and 533 are inserted at the outputs of the source latches 410, 430, 450, and 470, respectively. It should be noted that these WAM circuits 530, 531, 532, and 533 operate according to the same clock signal as that of the destination latch 550.

Assume further that the source latches 420, 440, and 460 operate according to the same clock signal as that of the destination latch 550. As a result, there is no need for a WAM circuit at the outputs of these source latches 420, 440, and 460.

It should be noted that there is only one signal path from the WAM circuit 530 to the OR gate 521, which is the final gate before the destination latch 550. In contrast, from each of the WAM circuits 531, 532, and 533, there are at least two different signal paths to the OR gate 521. For example, there are two different signal paths from the WAM circuit 532 to the destination latch 550. The first signal path goes through the gates 518, 523, 517, and 521 in that order, whereas the second signal path goes through the gates 518, 523, 513, and 521 in that order. As a result, there is a possibility of glitches at times of uncertainty associated with the WAM circuits 531, 532, and 533.

Therefore, a WAGG circuit 540 is inserted at the input of the destination latch 550 so as to provide the destination latch 550 with random values at times of uncertainty. Moreover, each of the WAM circuits 531, 532, and 533 sends an uncertainty notifying signal to the WAGG circuit 540. The three uncertainty notifying signals from the WAM circuits 531, 532, and 533 are Bored together by the OR gate 522.

As a result, during zero-delay simulation, whenever at least one of the WAM circuits 531, 532, and 533 asserts its uncertainty notifying signal to the WAGG circuit 540 via the OR gate 522 indicating to the WAGG circuit 540 that there is currently uncertainty in the system, the WAGG circuit 540 generates a random value at its output to reflect this uncertainty.

In summary, the WAM and WAGG circuits are inserted in a digital circuit design to improve the simulation result of the zero-delay simulation of the circuit design. More specifically, in the zero-delay simulation, whenever there is uncertainty regarding the value of the output of the circuit design, the inserted WAM and WAGES circuit ensure that the value of the output of the circuit design becomes random to reflect such uncertainty.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A digital circuit simulation method, comprising:
providing a digital circuit design which includes (a) a first source latch, (b) a destination latch, (c) a logic cone, (d) a first WAM (Wired Asynchronous Model) circuit electrically coupling an output of the first source latch to a first input of the logic cone, (e) a WAGG (Wired Asynchronous Glitch Generator) circuit electrically coupling an output of the logic cone to an input of the first source latch,
wherein the first source latch operates according to a first clock signal,
wherein the first WAM circuit and the destination latch operate according to a second clock signal which is asynchronous to the first clock signal, and
wherein there exist at least two different signal paths from the first input of the logic cone through the logic cone to the output of the logic cone;
performing a zero-delay simulation of the digital circuit design, wherein said performing the zero-delay simulation comprises in response to a first condition of (a) the first WAM circuit entering an uncertainty state in which the first WAM circuit generates a random value of 1 or 0 at the first input of the logic cone, (b) the logic cone being vulnerable to a positive glitch, and (c) the output of the logic cone being at logic 0, causing the WAGG circuit to generate a random value of 0 or 1 at the input of the destination latch; and in response to the WAGG circuit generating the random value of 0 or 1 at the input of the destination latch, determining that there is an uncertainty in term of value at the input of the destination latch.

2. The method of claim 1, further comprising in response to a data edge at the output of the first source latch and then a clock assertion of the second clock signal, causing the first WAM circuit to enter the uncertainty state.

3. The method of claim 1, further comprising in response to a clock assertion of the second clock signal when the first WAM is in the uncertainty state, causing the first WAM circuit to enter an actual state in which the first WAM passes a value of its input to its output.

4. The method of claim 1, wherein said performing the zero-delay simulation further comprises in response to a second condition of (a) the first WAM circuit entering the uncertainty state, (b) the logic cone being vulnerable to a negative glitch, and (c) the output of the logic cone being at logic 1, causing the WAGG circuit to generate a random value of 0 or 1 at the input of the destination latch.

5. The method of claim 4, wherein said performing the zero-delay simulation further comprises in response to a condition where neither the first condition nor the second condition is applicable, causing the WAGG circuit to pass a value of the output of the logic cone to the input of the destination latch unchanged.

6. The method of claim 1,
wherein the digital circuit design further includes (i) a second source latch and (ii) a second WAM circuit electrically coupling an output of the second source latch to a second input of the logic cone,
wherein the second source latch operates according to the first clock signal,
wherein the second WAM circuit operates according to the second clock signal,
wherein there exists only one signal path from the second input of the logic cone through the logic cone to the output of the logic cone, and
wherein during said performing the zero-delay simulation is performed, the operation of the WAGG circuit is not affected by a state of the second WAM circuit.

7. The method of claim 6,
wherein the digital circuit design further includes (i) a third source latch and (ii) a third WAM circuit electrically coupling an output of the third source latch to a third input of the logic cone,
wherein the third source latch operates according to the first clock signal,
wherein the third WAM circuit operates according to the second clock signal,
wherein there exists at least two different signal paths from the third input of the logic cone through the logic cone to the output of the logic cone, and
wherein said performing the zero-delay simulation further comprises in response to a third condition of (a) the third WAM circuit entering an uncertainty state in which the third WAM circuit generates a random value of 1 or 0 at the third input of the logic cone, (b) the logic cone being vulnerable to a positive glitch, and (c) the output of the logic cone being at logic 0, causing the WAGG circuit to generate a random value of 0 or 1 at the input of the destination latch.

8. The method of claim 7, wherein the digital circuit design further includes an OR gate, wherein the OR gate electrically couples the first and third WAM circuits to the WAGG circuit.

9. The method of claim 7, wherein said performing the zero-delay simulation further comprises in response to a fourth condition of (a) the third WAM circuit entering the uncertainty state, (b) the logic cone being vulnerable to a negative glitch, and (c) the output of the logic cone being at logic 1, causing the WAGG circuit to generate a random value of 0 or 1 at the input of the destination latch.

10. The method of claim 9, wherein said performing the zero-delay simulation further comprises in response to a condition where none of the first, second, third, and fourth conditions is applicable, causing the WAGG circuit to pass a value of the output of the logic cone to the input of the destination latch unchanged.

11. A digital circuit simulation method, comprising:
providing a digital circuit design,
wherein the digital circuit design includes (a) a first source latch, (b) a destination latch, (c) a logic cone, (d) a first WAM (Wired Asynchronous Model) circuit electrically coupling an output of the first source latch to a first input of the logic cone, (e) a WAGG (Wired Asynchronous Glitch Generator) circuit electrically coupling an output of the logic cone and an input of the first source latch;
wherein the first source latch operates according to a first clock signal,
wherein the first WAM circuit and the destination latch operate according to a second clock signal which is asynchronous to the first clock signal,
wherein there exist at least two different signal paths from the first input of the logic cone through the logic cone to the output of the logic cone;
performing a zero-delay simulation of the digital circuit design, wherein said performing the zero-delay simulation comprises in response to a first condition of (a) the first WAM circuit entering an uncertainty state in which the first WAM circuit generates a random value of 1 or 0 at the first input of the logic cone, (b) the logic cone being vulnerable to a negative glitch, and (c) the output of the logic cone being at logic 1, causing the WAGG circuit to generate a random value of 0 or 1 at the input of the destination latch; and in response to the WAGG circuit generating the random value of 0 or 1 at the input of the destination latch, determining that there is an uncertainty in term of value at the input of the destination latch.

12. The method of claim 11, further comprising in response to a data edge at the output of the first source latch and then a clock assertion of the second clock signal, causing the first WAM circuit to enter the uncertainty state.

13. The method of claim 11, further comprising in response to a clock assertion of the second clock signal when the first WAM is in the uncertainty state, causing the first WAM circuit to enter an actual state in which the first WAM passes a value of its input to its output.

14. The method of claim 11,
wherein the digital circuit design further includes (i) a second source latch and (ii) a second WAM circuit electrically coupling an output of the second source latch to a second input of the logic cone,
wherein the second source latch operates according to the first clock signal, wherein the second WAM circuit operates according to the second clock signal, wherein there exists only one signal path from the second input of the logic cone through the logic cone to the output of the logic cone, and wherein during said performing the zero-delay simulation is performed, the operation of the WAGG circuit is not affected by a state of the second WAM circuit.

15. The method of claim 14, wherein said performing the zero-delay simulation further comprises in response to a second condition of (a) the first WAM circuit entering the uncertainty state, (b) the logic cone being vulnerable to a positive glitch, and (c) the output of the logic cone being at logic 0, causing the WAGG circuit to generate a random value of 0 or 1 at the input of the destination latch.

16. The method of claim 15, wherein said performing the zero-delay simulation further comprises in response to a condition where neither the first condition nor the second condition is applicable, causing the WAGG circuit to pass a value of the output of the logic cone to the input of the destination latch unchanged.

17. The method of claim 14, wherein the digital circuit design further includes (i) a third source latch and (ii) a third WAM circuit electrically coupling an output of the third source latch to a third input of the logic cone, wherein the third source latch operates according to the first clock signal, wherein the third WAM circuit operates according to the second clock signal, wherein there exists at least two different signal paths from the third input of the logic cone through the logic cone to the output of the logic cone, and wherein said performing the zero-delay simulation further comprises in response to a third condition of (a) the third WAM circuit entering an uncertainty state in which the third WAM circuit generates a random value of 1 or 0 at the third input of the logic cone, (b) the logic cone being vulnerable to a positive glitch, and (c) the output of the logic cone being at logic 0, causing the WAGG circuit to generate a random value of 0 or 1 at the input of the destination latch.

18. The method of claim 17, wherein the digital circuit design further includes an OR gate, wherein the OR gate electrically couples the first and third WAM circuits to the WAGG circuit.

19. The method of claim 17, wherein said performing the zero-delay simulation further comprises in response to a fourth condition of (a) the third WAM circuit entering the uncertainty state, (b) the logic cone being vulnerable to a negative glitch, and (c) the output of the logic cone being at logic 1, causing the WAGG circuit to generate a random value of 0 or 1 at the input of the destination latch.

20. The method of claim 19, wherein said performing the zero-delay simulation further comprises in response to a condition where none of the first, second, third, and fourth conditions is applicable, causing the WAGG circuit to pass a value of the output of the logic cone to the input of the destination latch unchanged.

* * * * *